US008841752B1

(12) United States Patent
Chaware et al.

(10) Patent No.: US 8,841,752 B1
(45) Date of Patent: Sep. 23, 2014

(54) SEMICONDUCTOR STRUCTURE AND METHOD FOR INTERCONNECTION OF INTEGRATED CIRCUITS

(75) Inventors: Raghunandan Chaware, Mountain View, CA (US); Kumar Nagarajan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 111 days.

(21) Appl. No.: 13/246,728

(22) Filed: Sep. 27, 2011

(51) Int. Cl.
H01L 23/544 (2006.01)

(52) U.S. Cl.
USPC ............ 257/620; 438/462; 438/113; 438/458

(58) Field of Classification Search
USPC ........... 257/620, E21.523, E21.524; 438/462, 438/113, 458
See application file for complete search history.

(56) References Cited

U.S. PATENT DOCUMENTS

| 2008/0191318 | A1* | 8/2008 | Su et al. | 257/620 |
|---|---|---|---|---|
| 2012/0119354 | A1* | 5/2012 | Tsai et al. | 257/737 |
| 2013/0009316 | A1* | 1/2013 | Wang et al. | 257/774 |
| 2013/0049195 | A1* | 2/2013 | Wu et al. | 257/738 |

OTHER PUBLICATIONS

U.S. Appl. No. 13/159,338, filed Jun. 13, 2011, Nagarajan, Kumar, Xilinx, Inc., 2100 Logic Drive, San Jose, CA US.
Calmidi, V.V., "Thermal Performance of a Thin High Interconnect Density Organic Substrate for Flip-Chip Applications", 2005, 55th Electronic Components and Technology Conference, May 31 to Jun. 3, 2005, pp. 1728-1734, vol. 2.
Ernsberger, C.N., et al., "Colaminated Single and Multichip Package Development", 1997, 6th International Conference on Multichip Modules Proceedings 6th, Apr. 2-4, 1997, pp. 134-141, Denver, CO, USA.

* cited by examiner

Primary Examiner — Fernando L Toledo
Assistant Examiner — Mohammed Shamsuzzaman
(74) Attorney, Agent, or Firm — LeRoy D. Maunu

(57) ABSTRACT

In one or more embodiments, a semiconductor structure is provided that includes a plurality of interposer dice on an un-singulated segment of a semiconductor wafer. Scribe lanes circumscribing each of the plurality of interposer dice have widths of at least 2.5% of the width of each interposer die. Each interposer die includes a first contact array formed on a first side of the interposer die, a plurality of vias formed through the interposer die, one or more wiring layers formed on the first side of the interposer die and electrically coupling the first contact array to the plurality of vias, and a second contact array formed on a second side of the interposer die and electrically coupled to the plurality of vias.

11 Claims, 10 Drawing Sheets

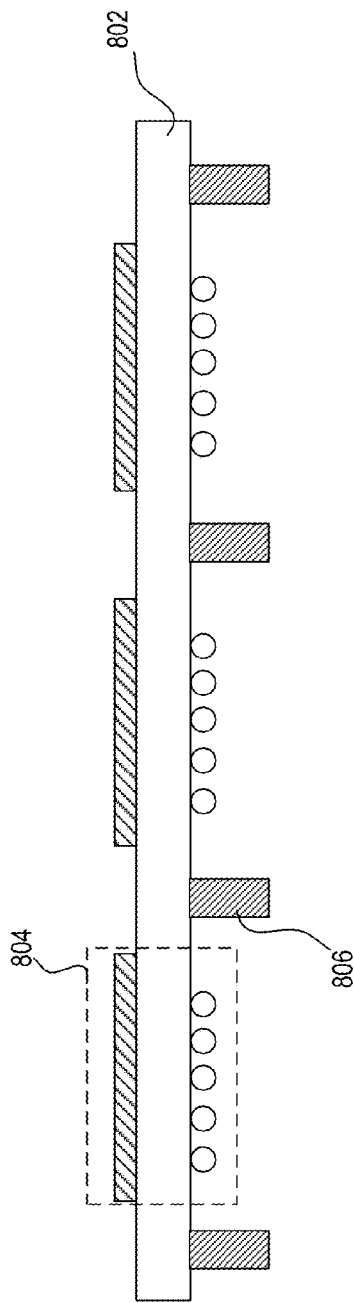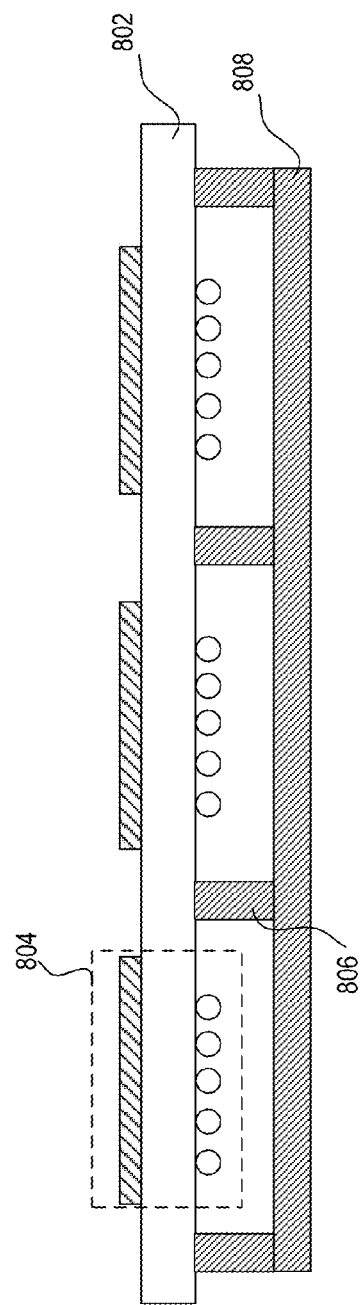

SEMICONDUCTOR STRUCTURE AND METHOD FOR INTERCONNECTION OF INTEGRATED CIRCUITS

FIELD OF THE INVENTION

This disclosure relates generally to semiconductor structures for connecting integrated circuits.

BACKGROUND

There are a number of methods for interconnecting an integrated circuit (IC) die with other circuits or a package. One approach forms an array of contacts directly on an IC die. The die is then flipped and aligned with a matching array of contacts formed on a printed circuit board or substrate. Contact arrays typically include a number of "solder balls" or "solder bumps" in a first contact array on the die and a number of self-aligning contact pads in a matching contact array on the substrate. Once aligned, the solder bumps are heated to reflow the solder bumps and electrically connect contacts of the first contact array with the contact pads of the matching contact array.

When reflow is complete and the die has been attached to the substrate, an air gap may remain between the die and substrate. This gap is commonly filled with material that flows into the gap in liquid form and then solidifies. This material is generally a mixture of an epoxy resin and small silica spheres and is often called underfill.

In many applications, however, it can be difficult to directly connect a die to another circuit or substrate, such as a printed circuit board (PCB). For example, if an IC die is to be mounted on a PCB, wiring of the PCB may be too coarse to connect to the fine contacts of the IC die. In such applications, the die and PCB may be interconnected through an interposer. An interposer is a silicon body having a first set of contacts on one side, to which a die may be bonded, and a second set of contacts on the other side for bonding to another chip, substrate, PCB, etc. Wiring and vias of the interposer may connect fine-pitched die contacts located on one side of the interposer to a coarser contact array on the opposite side of the interposer. An interposer may also provide interconnections between dice that are mounted on the same side of the interposer.

Through-silicon vias (TSVs) are used to connect the contacts of a first contact array on the front side of the interposer to contacts of a second contact array on the backside of the interposer. However, in forming TSVs in a silicon body of an interposer, the silicon body is often thinned to less than 100 μm. Metalized wiring layers are then added on the front side to connect the TSVs to contacts of the first contact array. For clarity and ease of reference, a top surface of an interposer, semiconductor die, substrate, or any layer thereof may be referred to as a front side and such terms are used interchangeably herein. Similarly, a bottom surface of an interposer, semiconductor die, substrate, or any layer thereof may be referred to as a backside and such terms are used interchangeably herein.

Due to differences in the coefficients of thermal expansion between the silicon body and the metal routing layer, and also due to film stresses generated during silicon layer processing, interposers have a tendency to warp during package assembly. When the interposer is heated to reflow solder joints of a die contact array, wiring in the metal routing layer expands faster than the silicon. As a result, the interposer may curve or warp. Because wiring for routing tends to be more concentrated on the periphery of the interposer, expansion tends to be uneven—further increasing the tendency to warp.

If the warpage of the interposer is not constrained properly, the solder ball connections of the interposer may not form properly during reflow. For example, as one possible consequence of warpage, when the interposer and die are to be bonded with a substrate, one or more solder balls of the interposer contact array may not make contact with the corresponding contact(s) of the substrate. Another possible consequence of warpage is that excess pressure may be placed on one or more solder balls—causing the solder balls to flatten when reflowed. As a result, adjacent solder balls may contact each other causing a short circuit.

One or more embodiments may address one or more of the above issues.

SUMMARY

In one or more embodiments a semiconductor structure is provided that inhibits warping of interposer dice. The structure includes a plurality of interposer dice on an un-singulated segment of a semiconductor wafer. Scribe lanes circumscribing each of the plurality of interposer dice have widths of at least 2.5% of the width of each interposer die. Each interposer die includes a first contact array formed on a first side of the interposer die, a plurality of vias formed through the interposer die, one or more wiring layers formed on the first side of the interposer die, and a second contact array formed on a second side of the interposer die. Each contact in the second contact array is electrically coupled to a corresponding one of the plurality of vias and the wiring layers electrically couple each contact of the first contact array to a corresponding one of the plurality of vias.

In another embodiment, a method of inhibiting warping of interposer dice is provided. A plurality of interposer dice is formed on a semiconductor wafer. The semiconductor wafer is diced into a plurality of segments, each segment includes one or more of the interposer dice and scribe lanes circumscribing each interposer die in the segment. The scribe lanes each have a width greater than 2.5% of a width of the one or more interposer dice in the segment.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings in which:

FIGS. 6-1 through 6-3 show example layouts of stiffening structures that may be formed in scribe lanes;

FIG. 7-1 shows a top view of an interposer wafer segment configured in accordance with one or more embodiments;

FIG. 7-2 shows a cross section of the interposer wafer segment shown in FIG. 7-1;

FIG. 7-3 illustrates IC die bonding on the interposer wafer segment shown in FIG. 7-2;

FIG. 7-4 illustrates bonding of the interposer wafer segment shown in FIG. 7-3 to a carrier substrate;

FIG. 7-5 illustrates dicing of the interposer wafer segment shown in FIG. 7-4; and FIGS. 8-1 and 8-2 illustrate possible placement of stiffening structures on the backside of the interposer dice.

DETAILED DESCRIPTION

One or more embodiments provide various interposer structures and methods for interconnecting a semiconductor die with an interposer that inhibits warping of the interposer during assembly.

Figure 1:
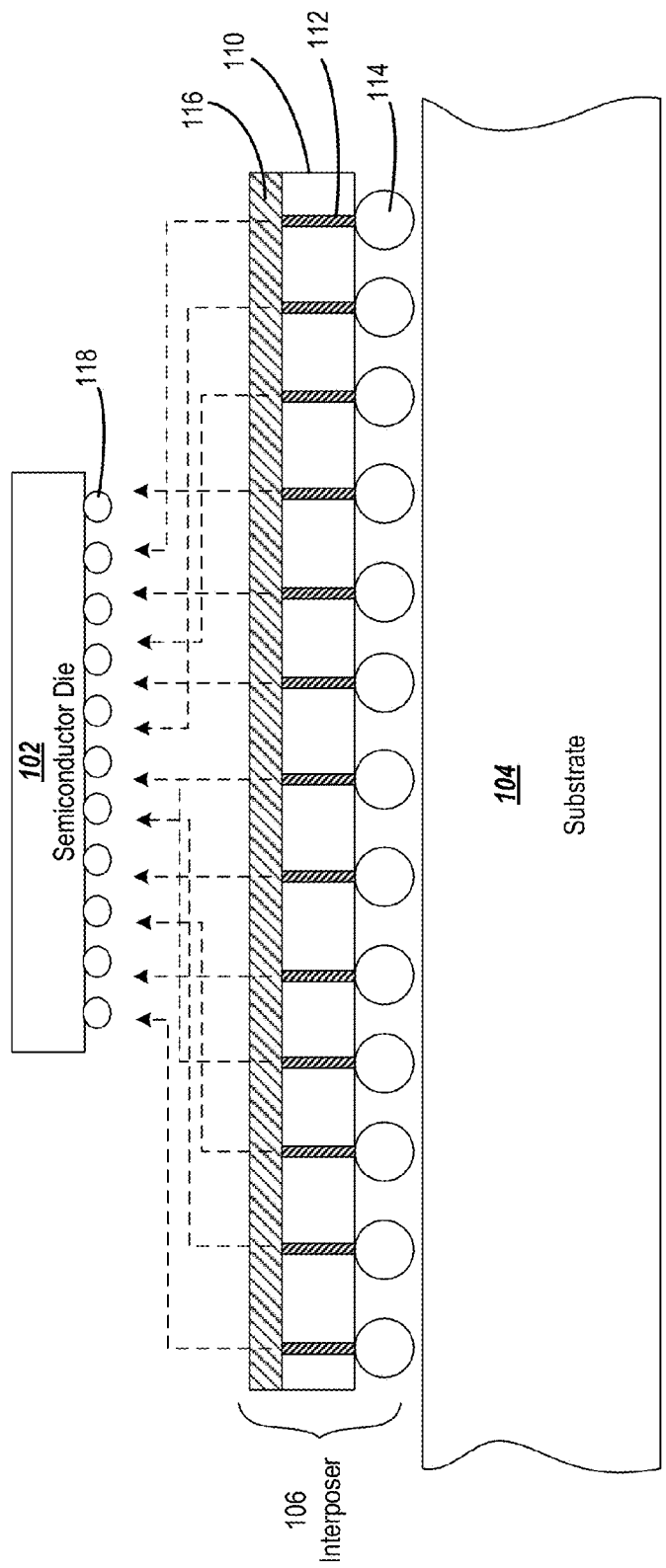
FIG. 1 shows an interposer for interconnecting a semiconductor die with a package substrate.

For ease of illustration and explanation, the embodiments and examples herein are primarily described with reference to the interconnection of a semiconductor die and a package substrate. FIG. 1 shows an example interposer for interconnecting a semiconductor die and a substrate. The interposer 106 electrically couples contacts of semiconductor die 102 to substrate 104. A semiconductor body such as, e.g., the interposer body 110 is typically formed of silicon. A number of through-silicon vias (TSVs) 112 are formed in the body. One or more wiring layers 116 are formed on the front side of the interposer body 110. The wiring layer(s) implement a plurality of circuit paths, which couple the TSVs to corresponding contact pads of a first contact array (not shown), formed on the front side of the interposer. Routing performed by the wiring layers is depicted by dashed lines. The wiring layers may route some of the TSVs to separate contact pads and others to the same contact pad. A second contact array having a plurality of solder ball contacts 114 is formed on a backside of the interposer body 110. The solder ball contacts 114 are coupled to corresponding ones of the TSVs. The solder ball contacts 114 are typically coupled to separate TSVs. However, in some implementations a second wiring layer may be implemented on the backside of the interposer body 110 to route two or more solder ball contacts to the same TSV. The second contact array may be aligned and coupled with a contact array 118 formed on the backside of the semiconductor die 102.

As described above, due to differences in the rates of thermal expansion of the interposer body 110 and the wiring layer 116, lateral stresses may be induced when solder balls of contact array 118 are heated or reflowed to couple the die 102 to the interposer 106. When solder balls of contact array 118 are reflowed to connect the die 102 to the interposer, the metal wiring layer(s) 116 and interposer body 110 are heated. Because the metal wiring has a larger coefficient of thermal expansion than the interposer bode 110, lateral stress is induced, which can cause the interposer to warp, particularly in outer corners of the interposer.

As one possible consequence of the warping, some solder ball contacts 114 of a backside contact array may not make contact with contact pads of a substrate when the interposer die 106 and substrate 104 are aligned. For example, if lateral stresses cause corners of the interposer to warp downward, solder ball contacts near the center of the interposer may not contact corresponding contact pads on the substrate. As another possible consequence of warping, solder ball contacts near the outer edge of the interposer may be flattened. As a result of the flattening, the adjacent solder ball contacts may contact each other, causing a short.

Figure 2:
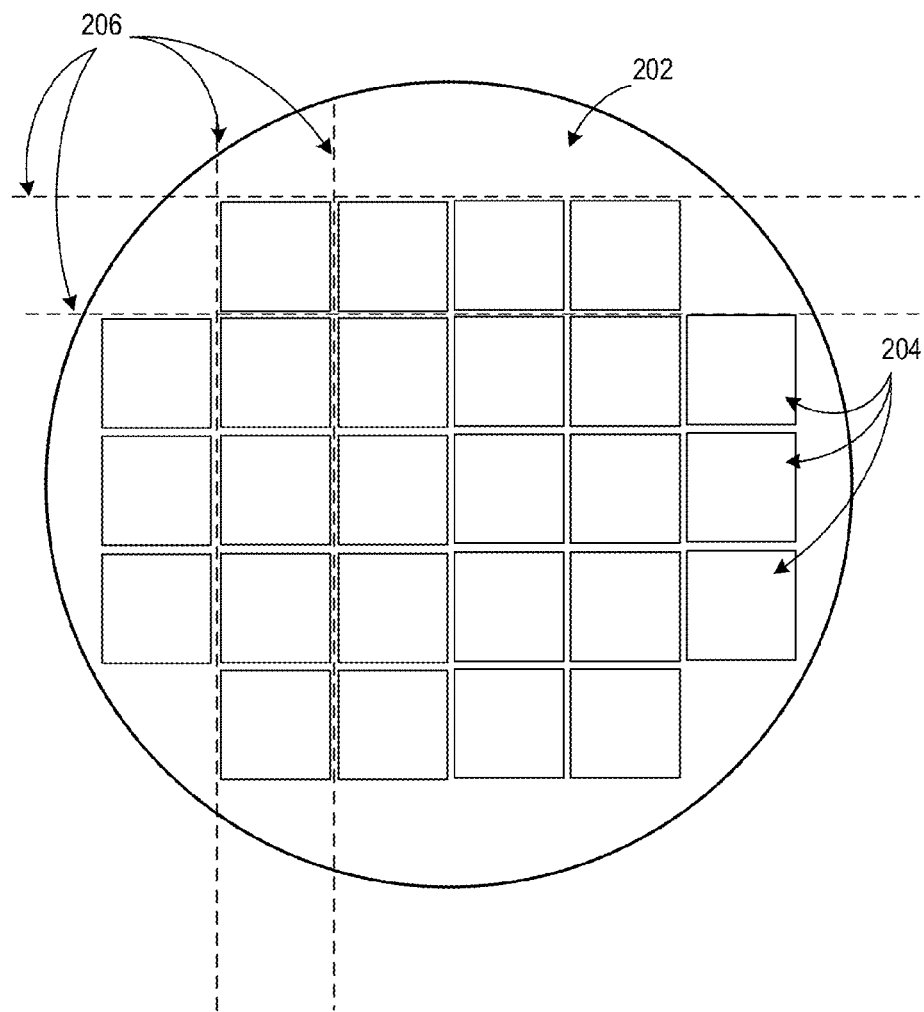
FIG. 2 shows a wafer configured to optimize the number of interposer dice.

Generally, interposer dice are printed on a semiconductor wafer using a layout that maximizes the number of interposer dice that may be printed on the wafer. Such layouts generally reduce the width of scribe lanes between dice to a minimum possible width that can be used to singulate the interposer dice without damage to the dice. FIG. 2 shows a top view of a wafer 202 configured to maximize the number of interposer dice 204. After forming interposer dice 204, the silicon wafer is cut in scribe lanes along lines 206 to singulate interposer dice for further processing. Due to the narrow scribe lanes, metal wiring of the singulated interposer dice 204 may be close to the edge of the singulated dice. As a result the interposer die have a tendency to warp during reflow, particularly in corners where the silicon wafer is least able to resist lateral stresses imposed by thermal expansion of the metal wiring.

One or more embodiments provide various interposer structures and methods for interconnecting a semiconductor die with an interposer in a manner that inhibits warping of the interposer during assembly. In contrast to conventional layout techniques, in one or more embodiments, interposer dice are printed on a silicon wafer using a layout with increased scribe lane widths between interposer dice. When the wafer is segmented, the excess scribe lane area not consumed by the cutting of the wafer is retained as a border that circumscribes each segment. This border assists in inhibiting warping of the interposer dice during reflow of interposer contact arrays.

Figure 3:
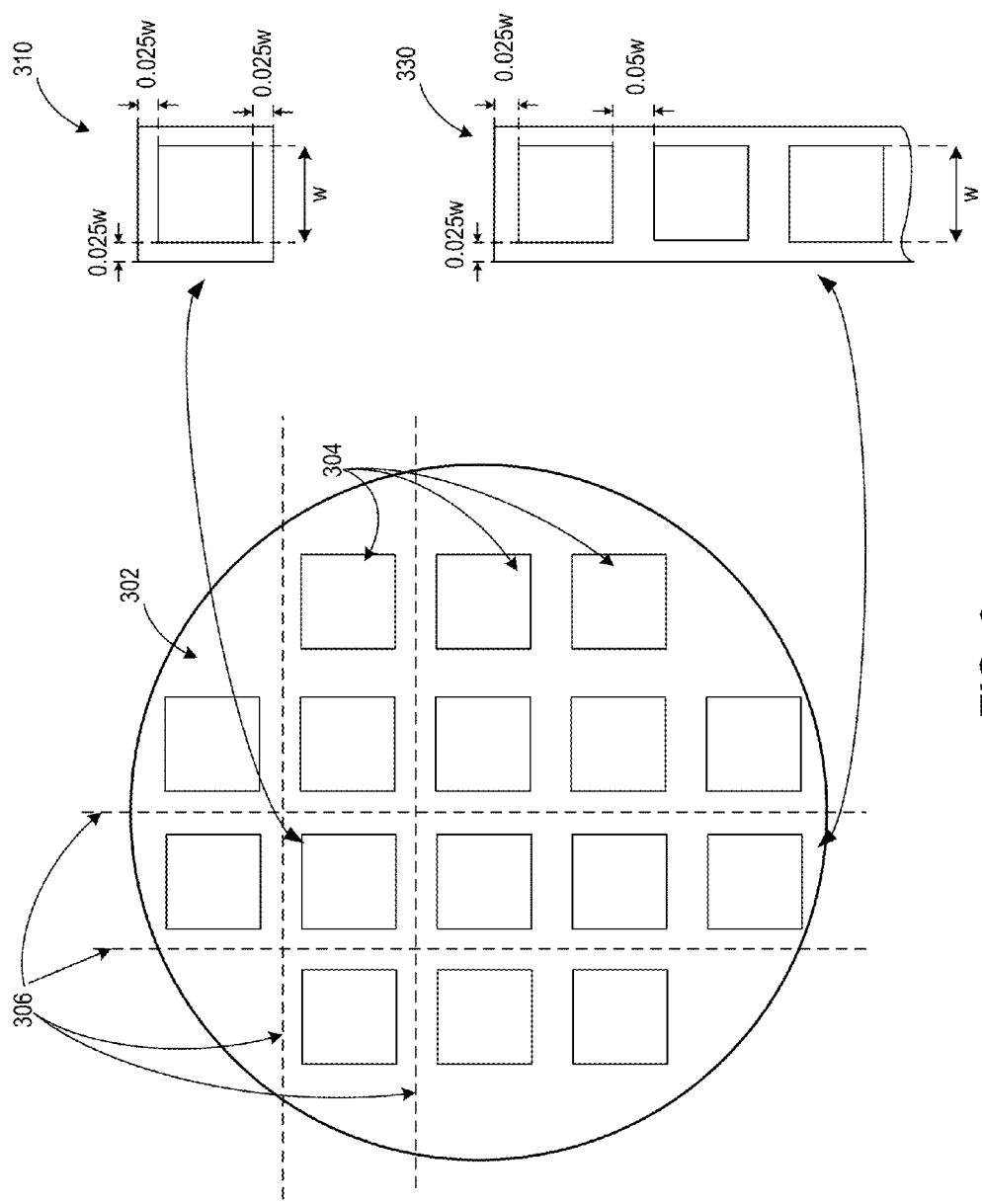
FIG. 3 shows a wafer having scribe lanes configured in accordance with one or more embodiments.

FIG. 3 shows a wafer 302 having scribe lanes configured in accordance with one or more embodiments. In this example, a plurality of interposer dice 304 are printed on a silicon wafer 302 with a uniform scribe lane width between each neighboring pair of interposer dice 304 on the silicon wafer 302.

Following formation of the interposer dice, the silicon wafer 302 is cut along lines 306 to segment the wafer into singulated interposer dice 310 or un-singulated segments 330. The cutting process leaves an excess portion of the wide scribe lanes circumscribing the interposer dice in each wafer segment 330.

It has been found that a scribe lane border, circumscribing the interposer dice in an un-singulated segment 330, of about 2.5% the width (w) of an interposer die may be sufficient to inhibit warping for interposer dice printed on 100 micron thick silicon wafer. It is recognized that scribe lane width may be increased or decreased depending on the thickness of the silicon wafer and the relative coefficients of thermal expansion of the wafer and metal layers. For example, for some applications in which the silicon wafer is thicker than 100 microns, the scribe lane width may be reduced. Likewise, for some applications in which the silicon wafer is thinner than 100 microns, scribe lane width may need to be increased in order to inhibit warping. For ease of illustration and explanation, the examples and embodiments are primarily described with reference to formation of interposer dice on a 100 micron thick silicon wafer with a layout that provides a scribe lane border of at least width 0.025*w circumscribing the interposer dice of each wafer segment.

Accordingly, in the example shown in FIG. 3, the wafer layout is implemented with scribe lanes between each neighboring pair of dice that are approximately 5% of the width (w) of one interposer die 304. For ease of illustration, scribe lanes and interposer die are not drawn to scale. After cutting along lines 306, excess scribe lane area provides a border, which circumscribes each wafer segment, that is 2.5% of the width of the interposer die (i.e., 0.05*w/2). For ease of explanation, cutting width is presumed to be negligible.

If the wafer is segmented into single dice, e.g., die 310, a border of width 0.025*w circumscribes the die. If the wafer is segmented into un-singulated segments of multiple interposer dice, e.g., segment 330, each un-singulated segment has a circumscribing border of width 0.025*w and scribe lanes of width 0.05*w between adjacent dice.

The border circumscribing the un-singulated segments may provide more resistance to warping of corners than excess scribe lane width provided between adjacent dice of the un-singulated segment. For one or more embodiments in which the wafer is segmented into un-singulated wafer segments 330, the width of scribe lanes between rows of interposers of the wafer 302 may be less than widths of scribe lanes between columns of interposer dice 304 of the wafer, thereby reducing widths of scribe lanes between adjacent dice in each un-singulated segment 330.

Figure 4:
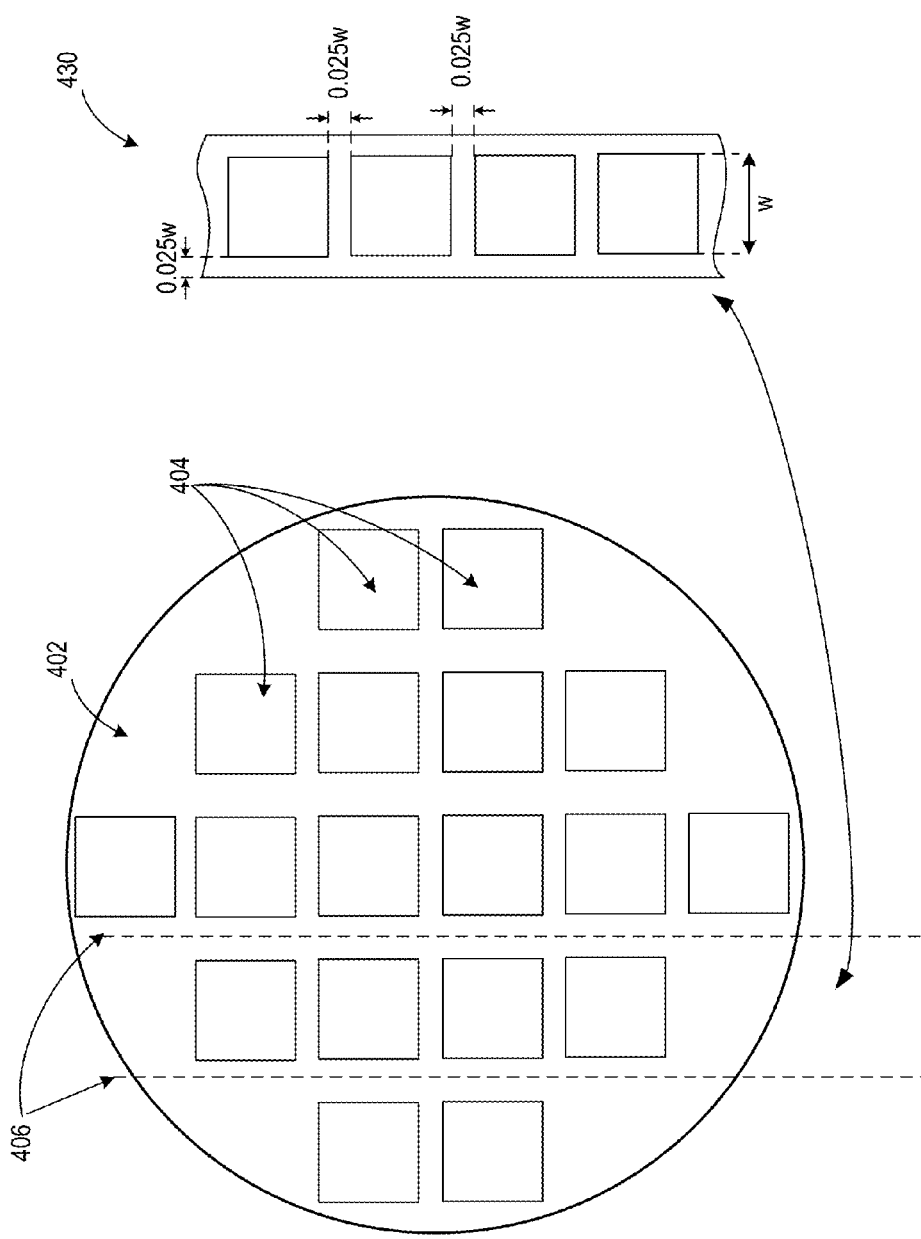
FIG. 4 shows a wafer having scribe lanes configured in accordance with one or more embodiments.

FIG. 4 shows a wafer 402 having scribe lanes configured in accordance with one or more embodiments. In this example, the width of scribe lanes between rows of interposer dice 404 in the silicon wafer 402 are one-half the width of scribe lanes between columns of interposer dice in the wafer 402. When columns of interposer dice of the wafer 402 are separated along lines 406 into un-singulated segments, 430, a scribe lane of width 0.025*w circumscribes each interposer die of the segment. Neighboring dice of the un-singulated segment are separated by a scribe lane of width 0.025*w.

Figure 5:
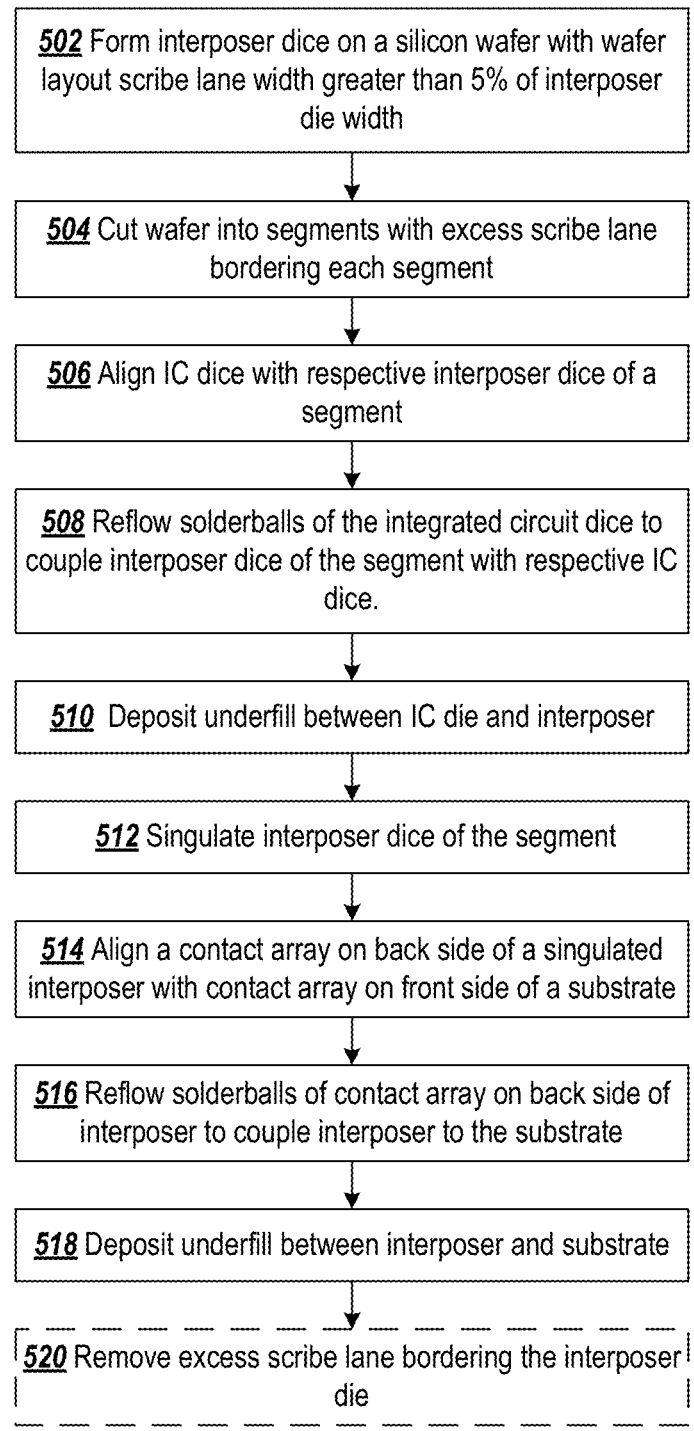
FIG. 5 shows a flowchart of a method for interconnecting an interposer, semiconductor die, and substrate in a manner that inhibits warping of an interposer.

FIG. 5 shows a flowchart of a method for interconnecting an interposer, IC die, and substrate in a manner that inhibits warping of the interposer. A plurality of interposer dice are formed on a silicon wafer at block 502 using a layout having a scribe lane width greater than 5% of the width of one or the interposer dice. The wafer may be cut into segments at block 504. Each segment is un-singulated in that it contains a plurality of interposer dice. Material of the scribe lanes that remains after segmenting forms a border around the segment of interposer dice. As discussed above, assuming negligible area is consumed in the segmenting, the border around the segment of interposer dice will be greater than 2.5%.

IC dice are aligned with respective interposer dice of each segment at block 506 such that a contact array on the backside of each IC die is aligned with a matching contact array on the front side of the corresponding interposer die. Solder balls are reflowed at block 508 to electrically couple the aligned contact arrays of the IC and interposer dice. As discussed above, the scribe lane circumscribing the segment and the wide scribe lanes between adjacent dice help to inhibit warping during reflow of the contact arrays. Following reflow, underfill is deposited in the gap between the IC and interposer dice at block 510 to securely bond the IC dice to the respective interposer dice and seal the corresponding contact arrays.

In this example, IC dice are aligned and bonded at blocks 506-510 following the segmentation performed at block 504. However, in some embodiments, IC dice may be aligned and bonded to the silicon wafer before any segmentation.

The interposer dice of the segment are singulated at block 512. Each singulated interposer die may be interconnected to a substrate according to the steps shown in blocks 514-518. A singulated interposer die is aligned with a substrate at block 514 such that a contact array on the backside of the interposer die is aligned with a matching contact array on the front side of the substrate. Solder balls are reflowed at block 516 to electrically couple the aligned contact arrays of the interposer die and substrate. Following reflow, underfill is deposited in the gap between the substrate and interposer die at block 518 to securely bond the interposer die to the substrate and seal the contact array.

In one or more embodiments, the excess scribe lane bordering a singulated interposer die may be removed at block 520 after bonding the interposer die to the substrate. In some other embodiments, any excess scribe lane area may be retained. In yet some other embodiments, excess scribe lane area may be removed during singulation of the interposer dice at block 512.

In the above description, solder balls of the contact array of the IC die are reflowed prior to depositing underfill between the interposer die and substrate. It is recognized that other underfill methods may be applied as well. For example, underfill may be deposited first and cured during the reflow of solder balls of the IC die.

The examples and embodiments are primarily described herein with reference to a process in which an IC die is bonded to the interposer die prior to bonding the interposer die to a substrate. However, the embodiments are not so limited. It is recognized that in some embodiments, the interposer dice may alternatively be singulated and bonded to a substrate prior to the bonding of IC dice to the front sides of the interposer dice.

In addition to the implementation and retention of wider scribe lanes described above, one or more embodiments further inhibit warping by implementing stiffening structures in the scribe lanes adjacent to the interposer dice. The stiffening structures provide additional rigidity to counteract lateral thermodynamic stresses imposed by the thermal expansion of wiring on the front side of the interposer dice.

Figures 1, 6:
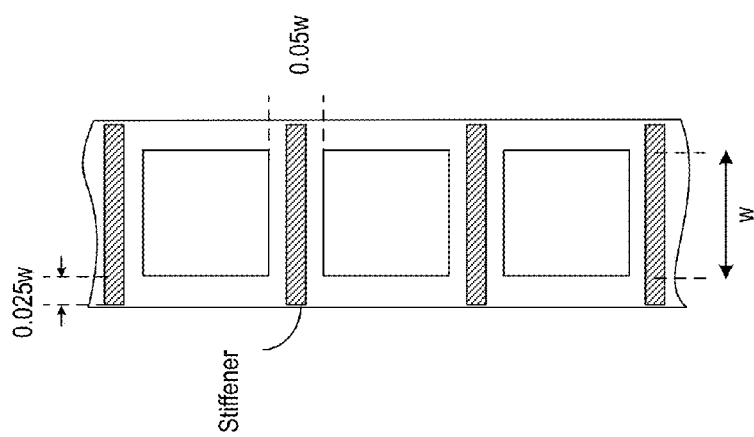
Figures 2, 6:
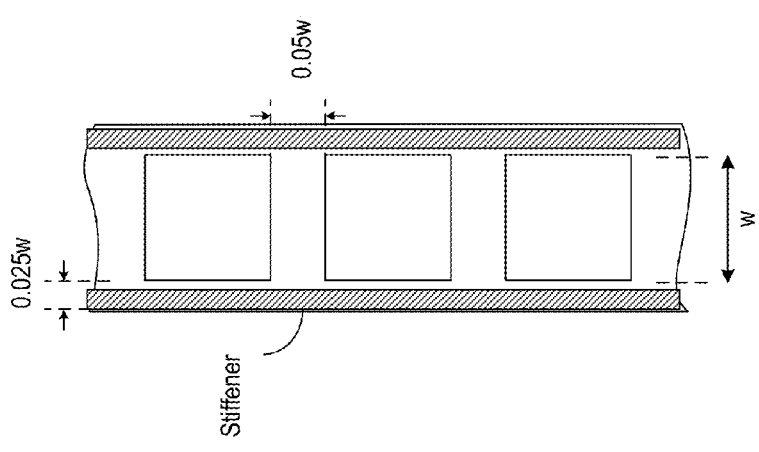
Figures 3, 6:
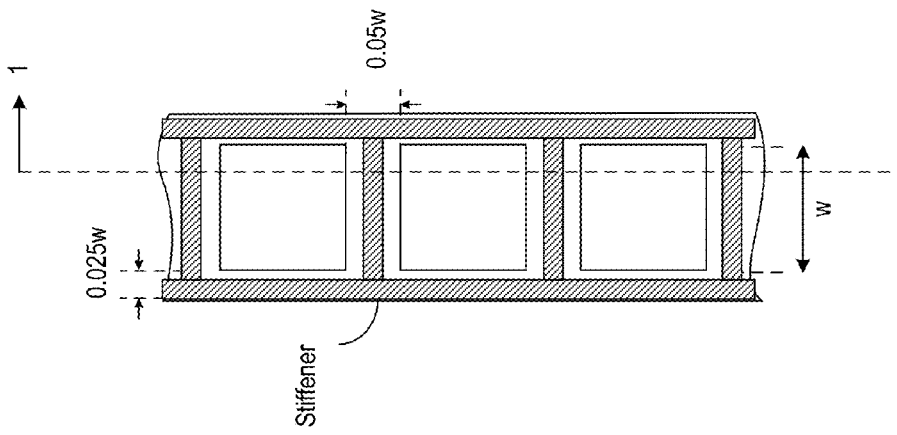

FIGS. 6-1 through 6-3 show an un-singulated wafer segment, similar to segment 330 shown in FIG. 3, with stiffening structures disposed in different arrangements on the scribe lanes. FIG. 6-1 shows an un-singulated wafer segment with stiffening structures formed in the scribe lanes between adjacent interposer dice of the segment. FIG. 6-2 shows an un-singulated wafer segment with stiffening structures formed in the scribe lanes along two edges of the un-singulated segment. FIG. 6-3 shows an un-singulated wafer segment with stiffening structures formed in each scribe lane of the un-singulated segment. It is recognized that stiffening structures may be utilized with other layouts as well.

While the stiffening structures described in relation to FIGS. 6-1 through 6-3 are primarily described as being formed after the wafer is cut into wafer segments, the embodiments are not so limited. In one or more embodiments, stiffening structures may be formed in scribe lanes of the wafer prior to cutting the wafer into segments. As such, in some embodiments, IC dice may be aligned and bonded to respective interposer dice of the wafer prior to segmentation.

The stiffening structures are formed of a material that possesses a rigidity that is sufficient to inhibit warping of the interposer dice when the solder balls of the interposers are heated to reflow temperatures. Some suitable stiffening structure materials include: aluminum, tungsten, epoxy, quartz, glass, silicon, silicone and silicone-based rubbers, fiberglass-reinforced epoxy, pregrep, or laminates, etc. It is recognized that the material and thickness for the stiffening structures may depend on coefficient of thermal expansion, amount, thickness of the silicon wafer, and distribution of the wiring material on the front side of the interposer body. For example, in one or more embodiments, material used to form stiffening structures may be selected to counter lateral stresses imposed by thermal expansion of wiring in the routing layer. In one or more other embodiments, stiffening structures may be formed of a material having a coefficient of thermal expansion that is the same as that of the silicon substrate.

Figures 1, 7:
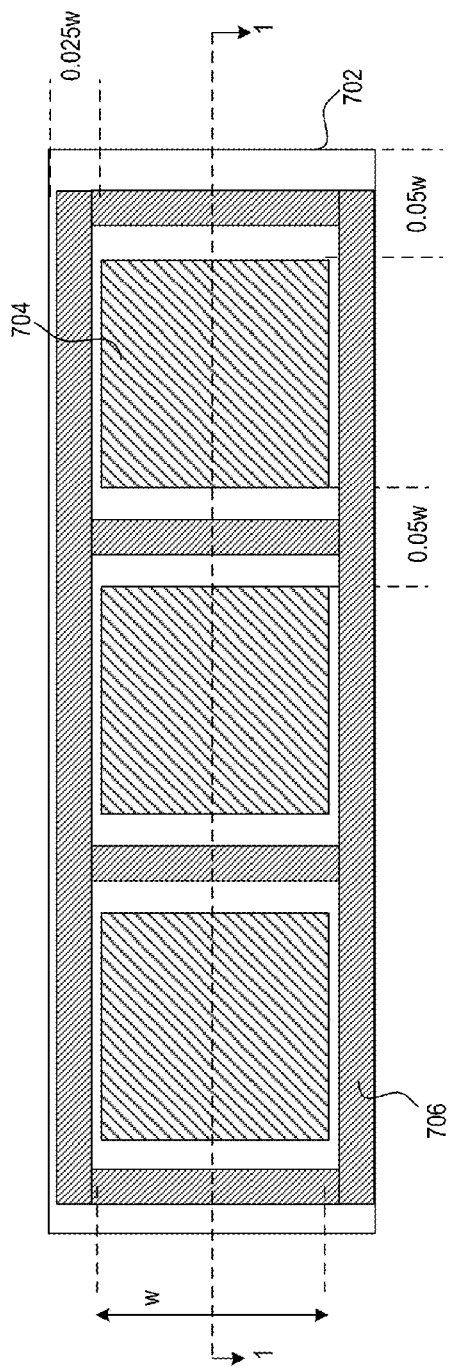
Figures 2, 7:
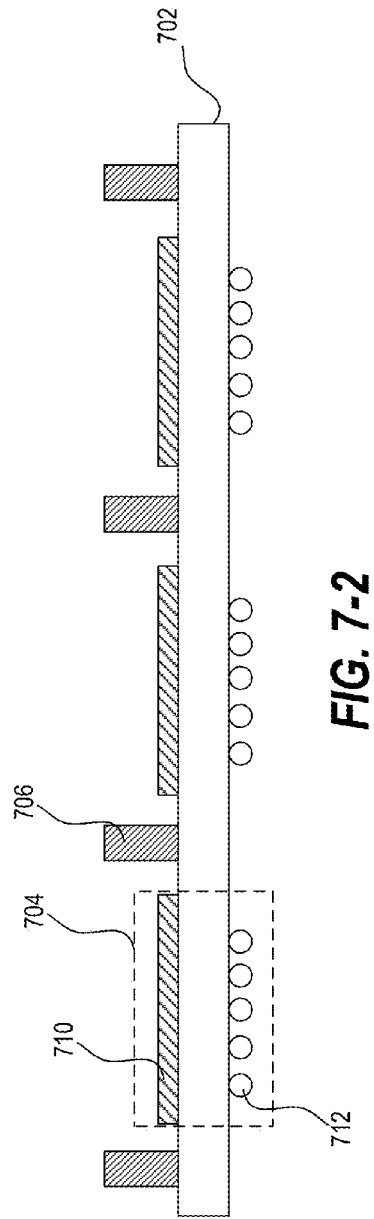
Figures 3, 7:
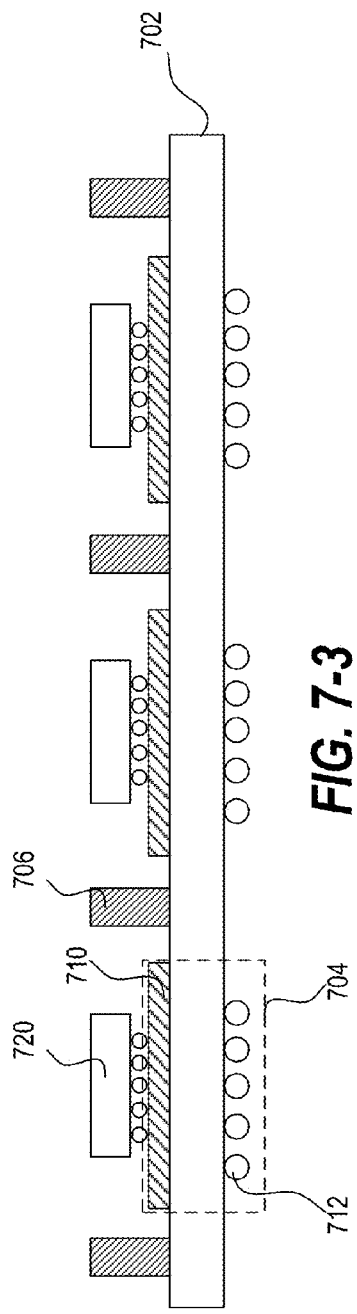
Figures 4, 7:
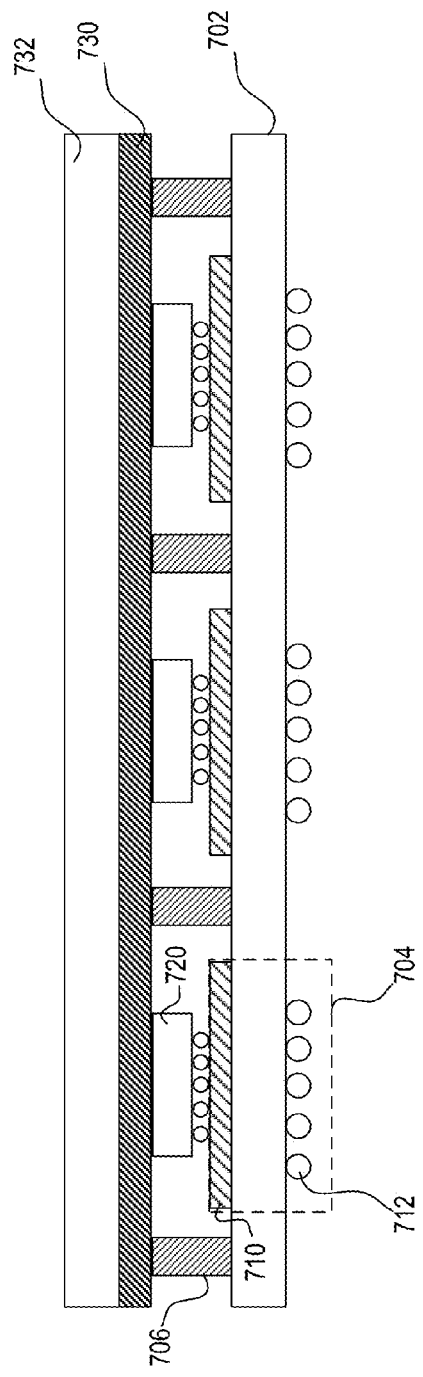
Figures 5, 7:
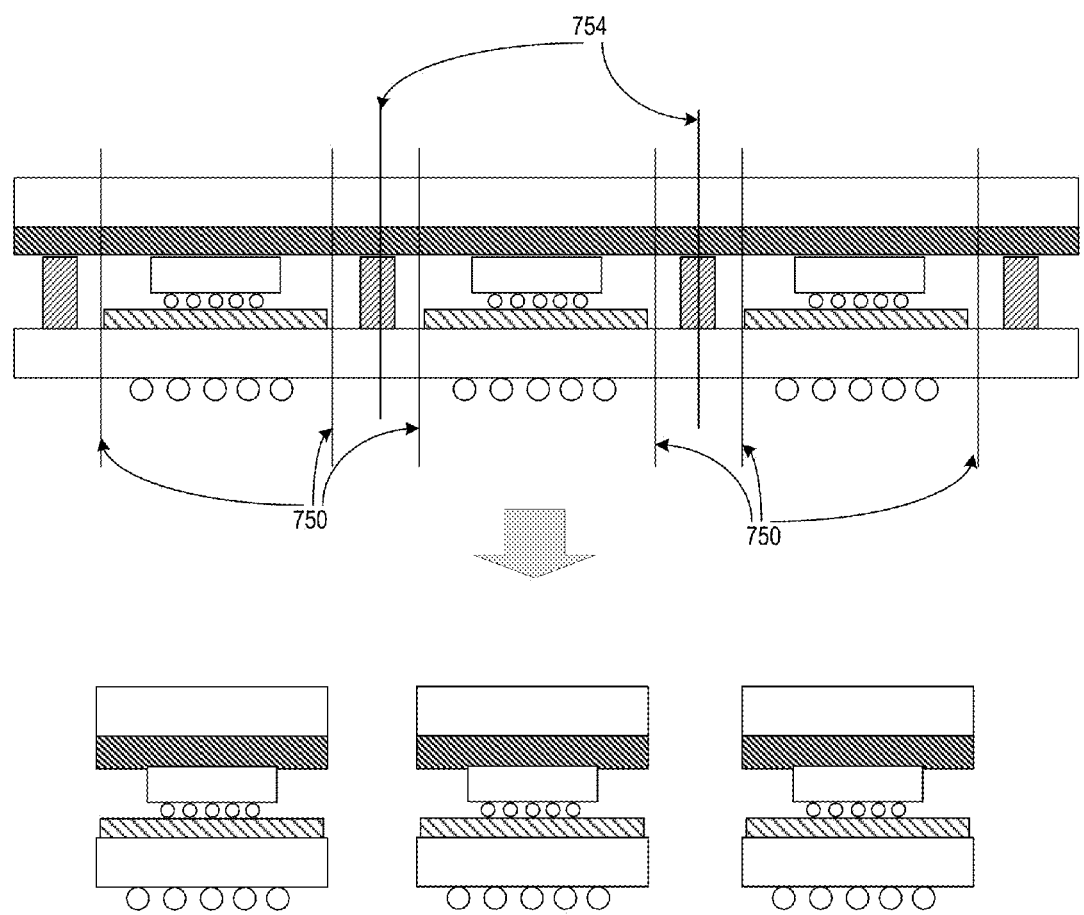

FIGS. 7-1 through 7-4 illustrate the interconnection of interposer die, semiconductor die, and substrate in accordance with one or more embodiments. FIG. 7-1 shows a top view of an un-singulated segment 702 having three interposer dice 704 and stiffening structures 706 patterned in a manner similar to that shown in FIG. 6-3. FIG. 7-2 shows a cross-section taken in direction 1 of FIG. 7-1. Each interposer die 704 includes a wiring layer and contact array 710 formed on a front side of the segment 702 and a second contact array 712 formed on a backside of the segment 702.

FIG. 7-3 shows three IC dice 720 aligned with and bonded to the three interposer dice 704. Similar to the method described with reference to FIG. 5, in one or more embodiments the interposer dice shown in FIG. 7-3 may be singulated and individually bonded to respective substrates.

In one or more embodiments, the un-singulated segment 702 may be bonded to a carrier substrate to provide additional rigidity. FIG. 7-4 shows a carrier substrate 732 bonded to stiffening structures of the un-singulated wafer segment shown in FIG. 7-3. The bonding may be with an adhesive layer 730.

FIG. 7-5 illustrates singulation of the un-singulated wafer segment shown in FIG. 7-4. In this example, the un-singulated segment is diced at cutting lines 750 with a laser or mechanical cutting means to singulate the die and remove excess scribe lanes.

In some implementations, cutting may be performed along lines, e.g., 754, such that the stiffening border and/or stiffening structures remain attached to the interposer dice. The remaining stiffening border and/or structures may further inhibit warping during the reflow in coupling the interposer die to the substrate. After bonding the interposer and substrate, the excess scribe lane border and/or stiffening structures may be removed. In some other embodiments, the excess scribe lane border and/or stiffening structures remain with the singulated interposer dice after bonding the interposer to the substrate. It is envisioned that in some manufacturing flows, an interconnected die and interposer may be shipped to another entity for further processing.

Depending on the embodiment, the singulated interposers and IC dice may be shipped with or without the carrier substrate 732 attached in order to provide support during shipping or further processing. In embodiments that separate the carrier substrate 732 from the singulated interposer dice, the carrier frame may be removed in a number of different ways. In one example embodiment, solvent may be used to dissolve the adhesive 730. In another embodiment, where the carrier substrate is only adhered to the stiffening structures, the substrate may be removed by cutting the un-singulated frame and segment along cutting lines 750 as described above. It is recognized that the method of removal may vary depending on the application, type of adhesive, material forming the carrier frame, etc.

While the above examples and embodiments are primarily illustrated and described with reference to stiffening structures placed in scribe lanes on the front side of the interposer dice, it is understood that the stiffening structures may be formed on the front side of the segment of interposer dice, backside of the segment, or both. For example, FIG. 8-1 illustrates a cross section of an un-singulated segment of interposer dice having stiffening structures formed on the backside of the segment. The un-singulated segment includes three interposer dice 804 formed on silicon wafer segment 802 similar to the structure discussed in relation to FIG. 7-2. Stiffening structures 806 are formed on the scribe lanes on the backside of the segment 802. FIG. 8-2 shows a stiffening layer 808 that may be bonded to the stiffening structures in one or more embodiments to provide additional rigidity and support.

The examples described herein are primarily described as having each contact of a contact array on a front side of the interposer connected to a respective contact of a contact array on the backside of the interposer. However, it is recognized that for some applications, not all die contacts are connected to a respective contact on the backside of the interposer. For example, multiple die contacts may be connected to the same interposer contact.

While embodiments may have been described in connection with a specific application, variations of these embodiments will be obvious to those of ordinary skill in the art. For example, the embodiments may be utilized in various combinations to further inhibit warping of an interposer during assembly. Therefore, the scope of the appended claims should not be limited to the foregoing description.

What is claimed is:

1. A semiconductor structure, comprising:
a plurality of interposer dice on an un-singulated semiconductor wafer, wherein scribe lanes between neighboring pairs of the dice have widths of at least 5.0% of the width of each interposer die plus an amount that compensates for material that would be removed in singulating the wafer, and each interposer die including:
a first contact array formed on a first side of the interposer die;
a plurality of vias formed through the interposer die;
one or more wiring layers formed on the first side of the interposer die and electrically coupling each contact of the first contact array to a corresponding one of the plurality of vias; and
a second contact array formed on a second side of the interposer die, each contact in the second contact array coupled to a corresponding one of the plurality of vias; and
for each interposer die of the plurality of interposer dice, one or more stiffening structures formed in and completely confined to one or more of the scribe lanes that circumscribe the interposer die, respectively, the one or more stiffening structures having a width of at least 2.5% of the width of each interposer die plus an amount that compensates for material that would be removed in singulating the wafer.

2. The semiconductor structure of claim 1, wherein the plurality of interposer dice is arranged in a row on the un-singulated wafer.

3. The semiconductor structure of claim 1, wherein the one or more stiffening structures include a stiffening structure disposed in the scribe lane between each pair of adjacent ones of the plurality of interposer dice.

4. The semiconductor structure of claim 1, wherein:
the plurality of interposer dice is arranged in a row on the un-singulated wafer; and
the one or more stiffening structures include a first stiffening structure disposed in the scribe lane along a first edge of the row, and a second stiffening structure disposed along a second edge of the row.

5. The semiconductor structure of claim 1, wherein the first side of the interposer die is co-planar with a first side of the un-singulated wafer, and the one or more stiffening structures are disposed on the first side of the un-singulated wafer.

6. The semiconductor structure of claim 1, wherein the first side of the interposer die is co-planar with a first side of the un-singulated wafer, the second side of the interposer die is co-planar with a second side of the un-singulated wafer, and the one or more stiffening structures are disposed on the second side of the un-singulated wafer.

7. The semiconductor structure of claim 1, wherein the first side of the interposer die is co-planar with a first side of the un-singulated wafer, the second side of the interposer die is co-planar with a second side of the un-singulated wafer, and the one or more stiffening structures include at least one stiffening structure disposed on the first side of the un-singulated wafer and at least one stiffening structure located on the second side of the un-singulated wafer.

8. The semiconductor structure of claim 1, further comprising, a carrier substrate affixed to the one or more stiffening structures by an adhesive.

9. The semiconductor structure of claim 1, wherein the one or more stiffening structures are comprised of a material that has a coefficient of thermal expansion sufficient to inhibit warping of the interposer die during reflow of solder balls to either the first or second contact arrays.

10. The semiconductor structure of claim 9, wherein the one or more stiffening structures are comprised of a material that has a coefficient of thermal expansion equal to a coefficient of thermal expansion of the semiconductor body.

11. The semiconductor structure of claim 1, further comprising a plurality of integrated circuit dice having respective contact arrays aligned with and electrically coupled to the respective ones of the first contact arrays of the plurality of interposer dice.

* * * * *